(12) United States Patent
Hahn et al.

(10) Patent No.: US 11,420,749 B2
(45) Date of Patent: Aug. 23, 2022

(54) ELECTRICAL CONNECTION SYSTEM FOR A SEAT

(71) Applicant: Airbus Operations GmbH, Hamburg (DE)

(72) Inventors: Dennis Hahn, Hamburg (DE); Sander Schroeder, Hamburg (DE); Felix Brenner, Hamburg (DE); Saurabh Awati, Hamburg (DE); Guido Kaiser, Hamburg (DE)

(73) Assignee: Airbus Operations GmbH

( * ) Notice: Subject to any disclaimer, the term of this patent is extended or adjusted under 35 U.S.C. 154(b) by 491 days.

(21) Appl. No.: 16/601,943

(22) Filed: Oct. 15, 2019

(65) Prior Publication Data

US 2020/0130844 A1 Apr. 30, 2020

(30) Foreign Application Priority Data

Oct. 30, 2018 (DE) .................... 10 2018 127 019.4

(51) Int. Cl.
*B64D 11/06* (2006.01)
*H05K 3/36* (2006.01)
(Continued)

(52) U.S. Cl.
CPC ............... *B64D 11/06* (2013.01); *B60N 2/64* (2013.01); *B60N 2/75* (2018.02); *B60R 11/0235* (2013.01);
(Continued)

(58) Field of Classification Search
CPC ...... B64D 11/06; B60N 2205/30; B60N 2/75; B60N 2/64; B60R 2011/0015;
(Continued)

(56) References Cited

U.S. PATENT DOCUMENTS

| 3,740,567 A * | 6/1973 | Atkins | B60N 2/002 280/801.1 |
| 7,306,283 B2 * | 12/2007 | Howick | H05B 3/34 297/180.12 |

(Continued)

FOREIGN PATENT DOCUMENTS

| DE | 10150533 A1 | 11/2002 |
| DE | 102009033041 A1 | 1/2011 |

OTHER PUBLICATIONS

German Search Report for Application No. DE 10 2018 127 019.4 dated Jul. 19, 2019, 2 pages (p. 2 categorizing cited references).

*Primary Examiner* — Philip F Gabler
(74) *Attorney, Agent, or Firm* — Lerner, David, Littenberg, Krumholz & Mentlik, LLP

(57) ABSTRACT

An electrical connecting system for a seat, in particular a passenger seat in a means of transportation, including an elongated carrier foil that is provided at least in regions with conductor tracks, the carrier foil having a first section so as to be arranged on a seat frame, a second section so as to be arranged on a backrest that may pivot and a transition section that lies between said first section and second section, wherein the transition section is embodied as V-shaped. As a consequence, an electrical connection may be achieved between an electronic unit that is arranged on a passenger seat and components that are arranged on the passenger seat.

14 Claims, 3 Drawing Sheets

(51) Int. Cl.
*B60R 11/02* (2006.01)
*B60N 2/75* (2018.01)
*H01R 12/70* (2011.01)
*B60N 2/64* (2006.01)
*B60R 11/00* (2006.01)

(52) U.S. Cl.
CPC ........... H01R 12/7076 (2013.01); H05K 3/36 (2013.01); *B60N 2205/30* (2013.01); *B60R 2011/0015* (2013.01); *H01R 2201/26* (2013.01)

(58) Field of Classification Search
CPC ............ B60R 11/0235; H01R 12/7076; H01R 2201/26; H05K 3/36
See application file for complete search history.

(56) References Cited

U.S. PATENT DOCUMENTS

| | | | | |
|---|---|---|---|---|
| 7,500,536 | B2* | 3/2009 | Bulgajewski | H05B 3/34 |
| | | | | 177/144 |
| 9,126,502 | B2* | 9/2015 | Kincaid | B60N 2/002 |
| 9,717,115 | B2* | 7/2017 | Li | B60N 2/5685 |
| 2006/0033507 | A1* | 2/2006 | Gaumel | B60R 21/01532 |
| | | | | 324/658 |
| 2008/0296942 | A1* | 12/2008 | Schweiker | B60N 2/5685 |
| | | | | 297/217.3 |
| 2013/0015687 | A1* | 1/2013 | Kramer | B64D 11/00155 |
| | | | | 297/217.3 |
| 2018/0056835 | A1* | 3/2018 | Konrad | B60N 2/5692 |
| 2018/0344035 | A1* | 12/2018 | Dry | H05B 3/36 |

\* cited by examiner

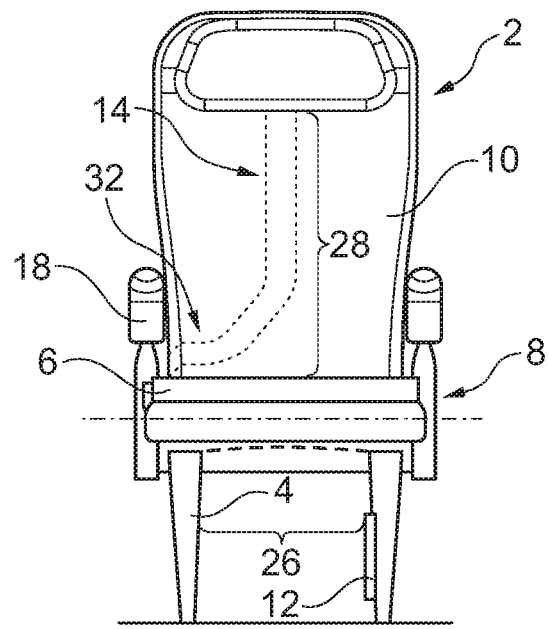
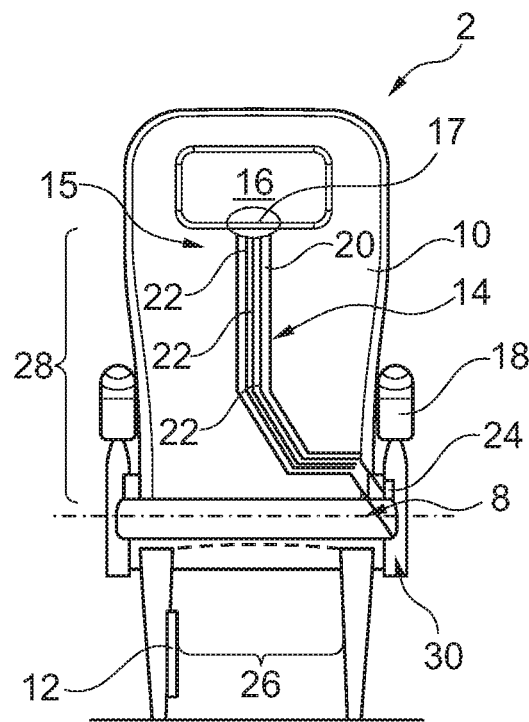
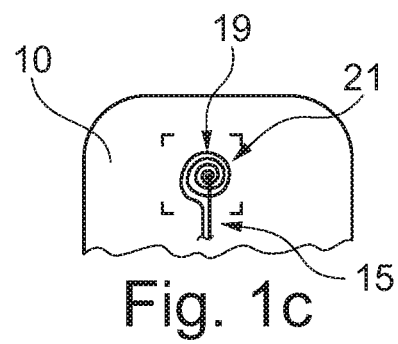
Fig. 1a
Fig. 1b
Fig. 1c

ELECTRICAL CONNECTION SYSTEM FOR A SEAT

FIELD OF THE INVENTION

The invention relates to an electrical connecting system for a seat, in particular a passenger seat in a means of transportation. The invention further relates to a passenger seat system for a means of transportation and an aircraft.

BACKGROUND OF THE INVENTION

In modern means of transportation and in particular in commercial aircraft, a series of comfort functions are often available to passengers in order to make the stay in the means of transportation as comfortable as possible. It is widely known to fit passenger seats, in particular with a screen on a backrest on which it is possible to play media. In addition to this, a series of input means are available on the screen or in the region of an armrest with which the passenger may interact or may select an entertainment program. Electronic units for actuating the selected functions are often arranged on a seat frame under seat surfaces and are electrically coupled to the screen and input means. The electrical connection is realized in the prior art via cables that are fitted with a plurality of insulated strands. These cables comprise a sufficient flexibility in order to also ensure a reliable connection to devices that are fixed to the seat frame in the case of backrests that may pivot.

Each cable comprises a specific net weight, which may lead to a considerable weight in larger means of transportation having many passenger seats. Moreover, a specific construction on the passenger seat might be required in order to guide and to protect the relevant cable. If an objective is the optimal utilization of an installation space for use by passenger seats, the use of cables of this type may be detrimental.

BRIEF SUMMARY OF THE INVENTION

Aspects of the invention may provide a passenger seat or a connecting device for a passenger seat with which it is possible to realize a connection of components that are installed in a seat, said connection weighing as little as possible and having as thin a construction as possible.

An electrical connecting system for a seat is proposed, in particular a passenger seat in a means of transportation. The connecting system comprises an elongated carrier foil that is provided at least in regions with conductor tracks, said carrier foil comprising a first section so as to be arranged on a seat frame, a second section so as to be arranged on a backrest that may pivot and a transition section that lies in between said first section and second section, wherein the transition section is embodied as V-shaped.

The electrical connecting system in accordance with an embodiment of the invention is consequently based not on the use of cables having individual strands that in each case comprise an insulation but rather is based on a carrier foil that is provided with conductor tracks. The carrier foil is elongated so that its longitudinal extent clearly exceeds the extent of its width. Individual lines may be realized by means of individual conductor tracks that are attached on the carrier foil spaced with respect to one another. The conductor tracks may be applied to the carrier foil by means of pressure using conductive material. One particular advantage of such a production procedure lies in the high degree of flexibility in the conception of the individual conductor tracks. Furthermore, the connecting system or a passenger seat may be designed at a particularly late point in time, in other words shortly prior to the production procedure ("late customising"). The production procedure may be performed in a fully automated manner and consequently may also be performed on demand. An individualisation procedure according to the request of the customer and an integration of many different functions is conceivable. It is possible to increase the number of individual connecting lines by means of increasing the number of conductor tracks, which only leads to an increase in the width of the carrier foil. Unlike in the prior art, it is also possible to realize a plurality of lines without requiring a larger construction for feeding through thicker line bundles. The thickness of the carrier foil in this case always remains unchanged.

For its use, the carrier foil should preferably be attached flush and flat on the individual components of the seat. A fastening arrangement of the carrier foil by way of example by means of adhesive, by means of straps or clamps leads to a construction on the component of the seat, which is hardly perceptible with the result that in comparison to solutions using conventional cable bundles, a depth extent of the passenger seat may be reduced at least on a small scale. Moreover, a carrier foil having conductor tracks that are arranged thereon may comprise a clearly lower weight than a cable having a corresponding number of lines. When the electrical connecting system in accordance with the invention is used in larger means of transportation, such as for example commercial aircraft, it could as a consequence even be possible to significantly reduce the weight.

The carrier foil may be produced from a polycarbonate or other thermoplastic materials. In particular, polycarbonate is flexible, resistive and cost-effective. It is possible to use polycarbonate with a particularly small thickness of by way of example approximately 200 μm for these application purposes.

A core aspect resides in the transition section. As described above, an electronic unit, a control unit or the like may be located in a region of a seat, which lies under a seat surface. By way of example, a seat may comprise a seat frame and such a control unit may be arranged on the underside of said seat frame. If a carrier foil extends from this region to an adjustable backrest, it is necessary to ensure the functional capability of the conductor tracks despite the bridging arrangement of a hinge and the constant changing of the orientation of the carrier foil during the planned serviceable life. The movement between the backrest and the seat frame must consequently be performed reliably without impairing the integrity of the carrier foil or the conductor tracks that are located thereon. This is achieved by virtue of the V-shaped transition section.

The first section may be located on the seat frame and may extend from a control unit or the like that is arranged at said seat frame in the direction of a hinge of the seat. The second section meanwhile extends on the backrest and always follows the movement of said backrest. In the installed state, the transition section spans the hinge section, wherein a limb of the V-shaped transition section is oriented from a hinge section towards the backrest and a second limb of the transition section is oriented towards the seat frame. The transition section with this shape may lie particularly well in the transition flush against surfaces of the seat. A pivoting movement of the backrest can also not impair the integrity of the carrier foil.

It is particularly preferred that the transition section comprises a first limb and a second limb, wherein the first limb and the second limb include an angle with respect to one another, said angle being in a range between 40° and 60° and preferably 45°. It has surprisingly been found that in this angular range intense pivoting movements may also be performed by a backrest without the carrier foil tearing or bulging. The limbs in this case are in particular embodied in a linear manner. A greater angle generally speaking may lead to an intense unfolding movement or bulging movement when the backrest is pivoted. In the case of a lesser angle, a small tear or expansion could also be conceivable.

The carrier foil could comprise an intersection line in the transition region, wherein an inner-lying end of the intersection line issues into a round notch. The notch in particular may be embodied as circular. As a consequence, it is rendered possible for a notch stress that is caused by the limbs to be conducted over a circumference of the notch with the result that the material of the carrier foil is not damaged. As a consequence, it is possible to prevent a tear of the carrier foil. In this context, reference is to be made to the fact that the intersection line is a line that is apparent as the geometric intersecting line of the two sections. The length of said line increases with the width of the carrier foil.

It is preferred that an outer-lying end of the intersection line issues into a rounded portion that is oriented radially outwards. In a similar manner to the round notch, the rounded portion that is oriented radially outwards may lead to avoiding an excess notch loading and gently bypassing the stress in the carrier foil onto the intersection line. The rounded portion may comprise the same radius as the above-mentioned round notch. However, it would also be possible to fit both features with different radii. In particular, the rounded portion could comprise a greater radius than the notch.

In one advantageous embodiment, an indicator light is arranged on or adjoins the transition section. The indicator light on the transition section may be visible in the installed state of the connecting system in the region of the hinge or between the backrest and the armrest in a region that is facing the seat surface. If the relevant passenger seat adjoins an aisle, for example flight attendants in the aircraft could recognise immediately whether the indicator light is active. The indicator light could be used for example to signal that specific functions of the passenger seat are in operation, which in specific flight states are not permitted. This could be by way of example the operation of an electronic device that the passenger has brought with them and that is coupled to the connecting system.

Moreover, the connecting system in accordance with an embodiment of the invention could comprise an additional elongated third section that extends outwards at an angle from the first section and comprises a lighting unit in a position that is spaced from the first section. The lighting unit is consequently arranged on a separate elongated third section that may extend from the first section to a desired site of the passenger seat. The lighting unit could in particular be embodied as emergency lighting by means of which passengers may be guided in particular to an exit or an emergency exit.

A first electrical connector for connecting the conductor tracks to an electronic unit that may be installed fixed to the seat frame could be arranged on an outer end of the first section, said end being spaced from the transition section. The first electrical connector may be inserted in particular in a computer that provides an on board entertainment program. In addition, user-controlled functions could also be provided that for example include switching on, switching off or dimming a light or communication. The conductor tracks that extend from the first electrical connector into the first section may comprise numerous different conductor tracks for different functions, said conductor tracks extending together or in groups to specific sites on the carrier foil. The first electric connector is consequently preferably the connector having the most conductor tracks that end therein.

The first section and/or the second section could comprise a bend towards the transition section. The bend is to be understood as a change in direction in the plane of the carrier foil. This carrier foil may be clearly geometrically limited by means of the bend of the transition section and in particular may dissipate a tensile or sheer load from the transition section. Moreover, it is conceivable that the transition section is fastened to the backrest at the sites at which the transition section ends in the bend.

One preferred embodiment comprises at least one electrical plug connector that may be attached to the passenger seat so as to connect to electronic mobile devices on demand. The electrical plug connector could extend in the installed state to a specific location on the passenger seat that is facing a user. The plug connector may furthermore comprise an additional, by way of example fourth section that extends outwards from the first section or the second section of the carrier foil. The plug connector could be based on a customary standard and could provide a low voltage of by way of example 5 V. Users may connect mobile end devices to said plug connector in order to charge said end device or to interact with an entertainment system via said end device. The plug connector may provide the opportunity to use by way of example a USB interface.

A second electrical connector for connecting the conductor tracks to a screen that is arranged fixed to the backrest is preferably arranged on an outer end of the second section. The second electrical connector consequently conducts current and data to a screen and may where applicable also transmit input signals from input means that are arranged on the screen to an electronic unit that is located on one end of the first section fixed to the seat frame or at another location, also outside the passenger seat.

The invention further relates to a passenger seat system for an aircraft, said passenger seat system comprising a seat frame, at least one seat surface that is located on said seat frame, a backrest that is mounted on a hinge so that said backrest may pivot with respect to the seat surface, an electronic unit that is arranged under the seat surface on the seat frame and a connecting system as described above, wherein the second section is arranged on the backrest, the transition section extends on the side above the hinge to an armrest and wherein the first section extends from the armrest under the seat surface to the electronic unit.

Finally, the invention relates to an aircraft comprising a passenger cabin having at least one passenger seat system of this type.

BRIEF DESCRIPTION OF THE DRAWINGS

Further features, advantages and application possibilities of the present invention are apparent in the following description of the exemplary embodiments and the figures. In this case, all the features that are described and/or illustrated alone and in any combination form the subject matter of the invention even independent of their composition in the individual claims or the references of said claims. Furthermore, identical reference numerals stand for identical or similar objects in the figures.

FIGS. 1a, 1b and 1c illustrate a passenger seat system having a connecting system that is arranged on said passenger seat system in a front view and a rear view and also a modified rear view.

DETAILED DESCRIPTION

Figure 2:
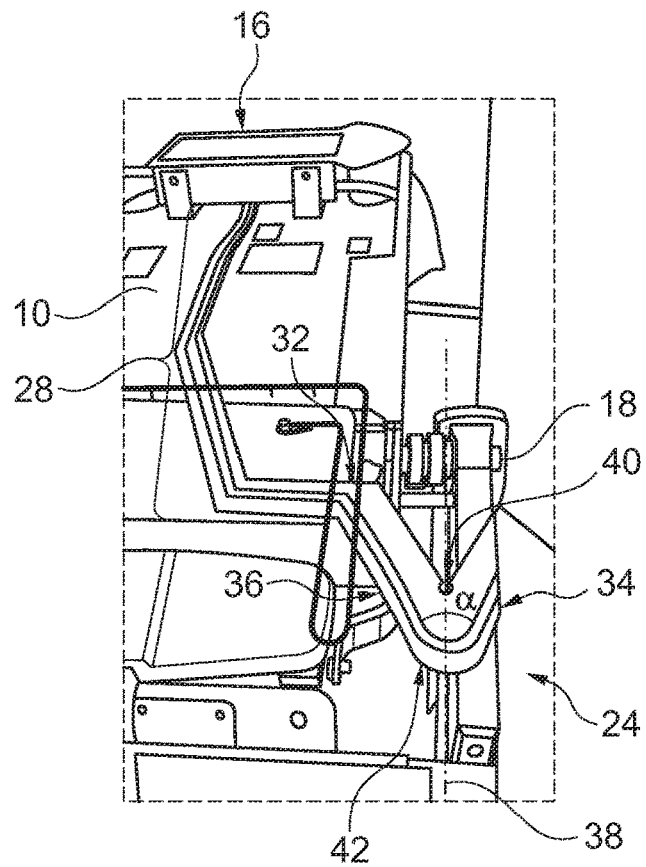
FIG. 2 illustrates a view of the backrest 10 at an angle from below.

FIGS. 1a and 1b illustrate a passenger seat system 2 in a front view (FIG. 1a) and a rear view (FIG. 1b) for an aircraft. The passenger seat system 2 comprises a seat frame 4, a seat surface 6 that is located on said seat frame, a backrest 10 that is mounted on a hinge 8 (indicated) so that said backrest may pivot with respect to the seat surface and an electronic unit 12 that is arranged on the seat frame 4 under the seat surface 6. A connecting system 14 is apparent on the backrest 10 and extends from a screen 16 in the direction of the hinge 8 and from that location to an armrest 18.

The connecting system 14 comprises a planar, elongated carrier foil 20 on which conductor tracks 22 are arranged. The combination of carrier foil 20 and conductor tracks 22 fulfils the function of an electrical cable, wherein the construction is however clearly flatter on account of the carrier foil than in the case of conventional cables. The carrier foil 20 may comprise a thickness that is clearly less than 1 mm. The conductor tracks 22 are preferably pressed onto the carrier foil 20 with the result that said conductor tracks likewise comprise a particularly small thickness. The number of conductor tracks 22 may be arbitrarily practically increased depending upon the requirement, which only increases the width of the carrier foil 20. The integration of new functions into a passenger seat system 2 may consequently be supported in a simple and cost-effective manner by means of simply exchanging the connecting system 12.

Since the backrest 8 is mounted so that it may pivot, a part of the carrier foil 20 must follow this movement. For this purpose, a transition section 24 is provided that is arranged between a first section 26 and a second section 28. The second section 28 only extends on the backrest 10, whilst the first section 26 extends in part on the armrest 18 and under the seat surface 6 (dashed line).

Bends 30 and 32 connect to the transition section 22, said bends being more visible in further following figures. The second section 28 therefore initially comprises an angular offset arrangement in the plane of the carrier foil 20 towards the transition section 24, before said transition section extends along the backrest 10. The first section 26 is likewise offset towards the transition section 24 by an angle in the plane of the carrier foil 20. As is illustrated schematically, the transition section 24 is embodied as V-shaped and is further illustrated in the further following figures.

The electrical connecting system 14 may be provided on one outer end 15 of the second section 26 with a second connector 17 that is coupled to the screen 16. This connector is referred to as "second connector" since a "first connector" is located on the first section as is further explained below in relation to FIG. 4.

FIG. 1c illustrates a part of the backrest 10 in a slight modification. Here in lieu of a screen 16 only a coil 19 is arranged with the aid of which it is possible to couple a mobile end device to a current supply that is provided by the electronic unit 12. The coil 19 may be connected to a corresponding electronic control system (not illustrated) that renders it possible to fulfil a standard, by way of example the QI standard.

The backrest 10 may furthermore comprise multiple holders 21 in or on which a user may fasten an end device, which they have brought with them, to the backrest 10 in order to obtain a continuous current supply. By way of example, the user may consume media data via wireless communication without a cable being required so as to supply current.

It is apparent directly under the armrest 18 in FIG. 2 in a detailed illustration of a region that the transition section 24 is embodied as V-shaped. For this purpose, the transition section 24 comprises a first limb 34 and a second limb 36 that include an angle α with respect to one another, said angle being in the range of 40° to 60°. The first limb 34 and the second limb 36 in this case form an intersection line 38 that in the installed state of the connecting system 2 in the case of a backrest 10 that is pivoted upwards extends to a great extent vertically and is arranged between the backrest 10 and the armrest 18. Both limbs 34 and 36 extend flat on the backrest 10 or on a side surface of the armrest 18.

The intersection line 38 comprises on one inner end a round notch 40 by means of which notch stresses are reduced and a tear is prevented during the pivoting movement of the backrest 10 and the deformation of the transition section 24 that is consequently caused. Meanwhile, a rounded portion 42 is provided in a similar manner on one outer end of the intersection line 38.

Furthermore, the bend 32 between the second section 28 and the transition section 24 is apparent in FIG. 2. The second section 28 extends on an exemplary track that bends multiple times over the backrest 10 and lies in this case always flush on the surface of the backrest 10. Obviously, other courses are conceivable that may be rounded or bent multiple times. Depending upon the requirement, branches may be provided that are connected to additional electronic devices. The screen 16 consequently does not form an exhaustive list.

Figure 3:
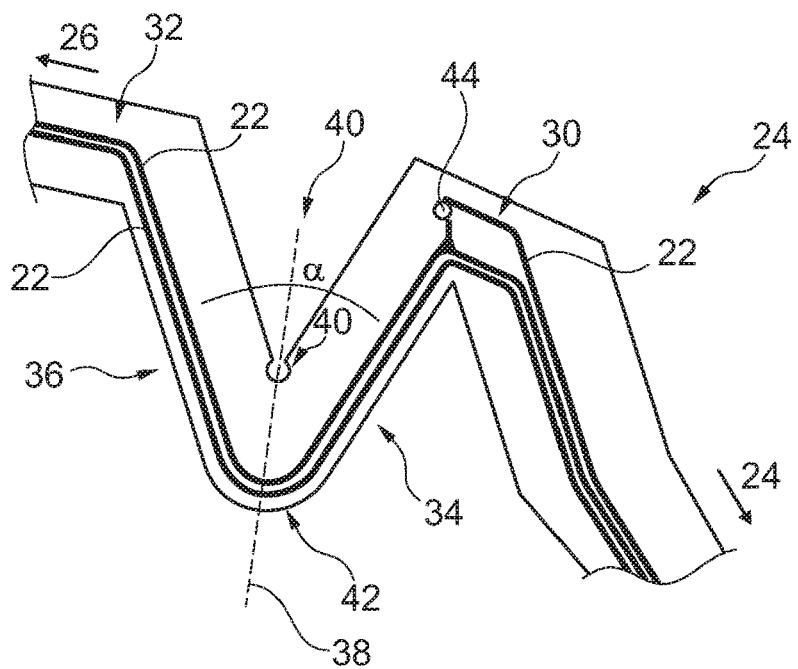
FIG. 3 illustrates a detailed illustration of the transition section.

FIG. 3 illustrates the transition section 24 in a shaped form. In this case, the angle α between the two limbs 34 and 36, the notch 40 and the rounded portion 42 are particularly apparent. In addition thereto, the first bend 30 is illustrated in detail on which furthermore an indicator light 44 is integrated in the form of an LED. This could possibly display the use of a specific device, by way of example an electrical plug connector (not illustrated here). Since the transition section 24 is located in the region of the hinge 8, the indicator light 44 may be positioned on one side surface of the armrest 18. If the seat is fastened to an aisle in the aircraft, it is possible to see the indicator light 44 from the aisle. As a consequence, it is possible to alert cabin crew as to whether specific electronic devices are in use.

It is conceivable as is illustrated with the aid of FIGS. 2 and 3 that by way of example the screen 16 is only supplied with an electrical voltage and data for representing image content is provided by means of a wireless network. As a consequence, the outlay for cabling may be even further reduced in that only two conductor tracks 22 are guided to the screen 16. The indicator light 44 therefore only requires a third conductor track 22 on which a positive voltage is provided on demand and the indicator light 44 is illuminated via a shared negative pole or neutral conductor. Obviously, however, other variants are also conceivable in which multiple conductor tracks 22 are also used in order to conduct data. In this case, corresponding shielding measures are to be taken where applicable.

Figure 4:
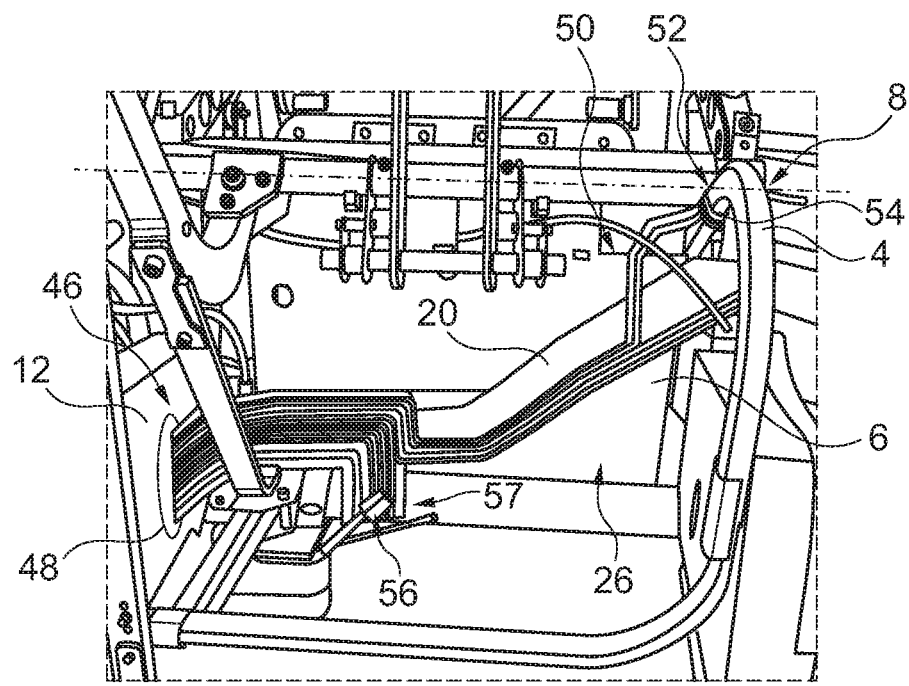
FIG. 4 illustrates a plan view of a seat surface of a seat from below.

FIG. 4 illustrates a plan view from below of the seat surface 6 under which the first section 26 of the carrier foil 20 extends. A first electrical connector 48 is arranged on one end 46 of the first section 26 and said electrical connector may be connected to the electronic unit 12. All the conductor tracks 22 consequently originate from the first connector 48 and are selectively branched off from the first section 26.

By way of example, an elongated third section 50 branches off from the first section 26 and is arranged on an outer-lying region of the seat frame (here: part of a "baggage bar"). A lighting unit 54 is arranged on one end 52 of the third section 50 and said lighting unit may be used as emergency lighting in order to guide passengers to an exit or emergency exit. This may also simply be an LED that is adhered to the carrier foil 20 and is connected to conductor tracks 22.

Moreover, an electrical plug connector 56 is provided on the first section 26, said plug connector by way of example comprising a USB socket and being used to charge mobile end devices of passengers. A third connector 57 that may be used so as to connect a voltage converter is arranged in close proximity to the first connector 48. A so-called "seat power box" could be connected that converts an on-board alternating current voltage that comprises approximately 115 V at 400 Hz into an alternating current voltage having 115 V and 60 Hz AC and also direct current voltages having 3 V and 28 V. Consequently, it is therefore possible by way of example to operate the electronic unit 12.

Figure 5:
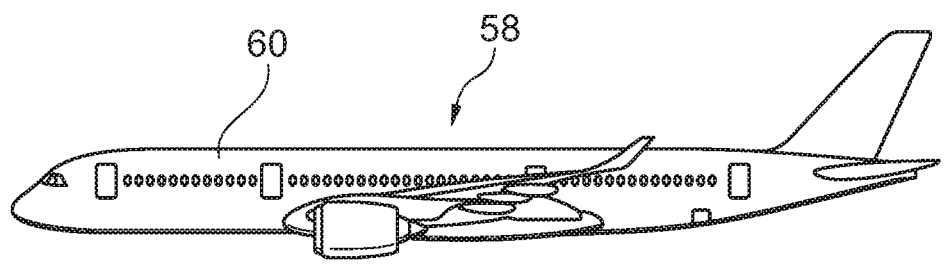
FIG. 5 illustrates an aircraft in a side view.

Finally, FIG. 5 illustrates an aircraft 58 having a passenger cabin 60 arranged therein and at least one passenger seat system 2 is arranged in said passenger cabin.

In addition, reference is to be made to the fact that "comprising" does not exclude any other elements or steps and "one" does not exclude a plurality. Moreover, reference is to be made to the fact that features that have been described with reference to one of the above exemplary embodiments may also be used in combination with other features of other exemplary embodiments described above. Reference numerals in the claims are not to be seen as limiting.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

LIST OF REFERENCE NUMERALS

2 Passenger seat system
4 Seat frame
6 Seat surface
8 Hinge
10 Backrest
12 Electronic unit
14 Connecting system
15 End of the second section
16 Screen
17 Second connector
18 Armrest
29 Coil
20 Carrier foil
21 Holder
22 Conductor tracks
24 Transition section
26 First section
28 Second section
30 Bend
32 Bend
34 First limb
36 Second limb
38 Intersection line
40 Notch
42 Rounded portion
44 Indicator light
44 End of the first section
46 End of the first section
48 First electrical connector
50 Third section
52 End of the third section
54 Lighting unit
56 Plug connector
57 Third connector
58 Aircraft
60 Cabin
α Angle between first and second limb of the transition section

The invention claimed is:

1. An electrical connecting system for a seat in a means of transportation, said electrical connecting system comprising:
   an elongated carrier foil provided at least in regions with conductor tracks, said carrier foil comprising:
      a first section configured to be arranged on a seat frame;
      a second section configured to be arranged on a backrest configured to pivot; and
      a transition section lying between said first section and second section, wherein the transition section is embodied as V-shaped.

2. The connecting system according to claim 1, wherein the transition section comprises a first limb and a second limb, wherein the first limb and the second limb include an angle with respect to one another, said angle being in a range between 40° and 60°.

3. The connecting system according to claim 1, wherein the carrier foil comprises an intersection line in the transition section, wherein an inner-lying end of the intersection line issues into a round notch.

4. The connecting system according to claim 3, wherein an outer-lying end of the intersection line issues into a rounded portion oriented radially outwards.

5. The connecting system according to claim 1, wherein an indicator light is arranged on or adjoins the transition section.

6. The connecting system according to claim 1, further comprising an additional elongated third section extending outwards at an angle from the first section and comprising a lighting unit in a position spaced from the first section.

7. The connecting system according to claim 1,
   wherein a first electrical connector for connecting the conductor tracks to an electronic unit configured to be installed fixed to the seat frame is arranged on an outer end of the first section, said end spaced from the transition section.

8. The connecting system according to claim 1, wherein the first section and/or the second section comprise a bend towards the transition section.

9. The connecting system according to claim 1, further comprising at least one electrical plug connector configured to be attached to the passenger seat so as to connect to electronic mobile devices on demand.

10. The connecting system according to claim 1, wherein a second electrical connector for connecting the conductor tracks to a screen arranged fixed to the backrest is arranged on an outer end of the second section.

11. The connecting system according to claim 1, wherein a coil for coupling to a mobile end device is arranged on the second section.

12. A passenger seat system for an aircraft, said passenger seat system comprising:
   a seat frame;
   at least one seat surface located on said seat frame;
   a backrest mounted on a hinge so that said backrest is configured to pivot with respect to the seat surface;
   an electronic unit arranged under the seat surface on the seat frame; and
   a connecting system according to claim 1,
   wherein the second section is arranged on the backrest, the transition section extends on the side above the hinge to an armrest and wherein the first section extends from the armrest under the seat surface to the electronic unit.

13. The passenger seat system according to claim 12, wherein the electronic unit is arranged on a side of the seat frame that is remote from the transition section and the first section extends along an underside of the seat surface.

14. An aircraft comprising a passenger cabin having at least one passenger seat system according to claim 12.

* * * * *